(12) United States Patent
Chen et al.

(10) Patent No.: US 10,916,320 B2
(45) Date of Patent: Feb. 9, 2021

(54) SHIFT REGISTER UNIT, DRIVING METHOD THEREOF, GATE DRIVE CIRCUIT, AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Shuai Chen, Beijing (CN); Zhi Zhang, Beijing (CN); Xiuzhu Tang, Beijing (CN); Yuanbo Zhang, Beijing (CN); Zhihui Wang, Beijing (CN); Qian Qian, Beijing (CN); Lijun Xiong, Beijing (CN); Tao Zhou, Beijing (CN); Xing Dong, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 63 days.

(21) Appl. No.: 16/331,004

(22) PCT Filed: May 30, 2018

(86) PCT No.: PCT/CN2018/088957
§ 371 (c)(1),
(2) Date: Mar. 6, 2019

(87) PCT Pub. No.: WO2019/033823
PCT Pub. Date: Feb. 21, 2019

(65) Prior Publication Data
US 2019/0189234 A1  Jun. 20, 2019

(30) Foreign Application Priority Data
Aug. 16, 2017  (CN) .......................... 2017 1 0706066

(51) Int. Cl.
*G11C 19/00* (2006.01)
*G11C 19/28* (2006.01)
(Continued)

(52) U.S. Cl.
CPC ............. *G11C 19/287* (2013.01); *G09G 3/20* (2013.01); *G09G 3/3677* (2013.01); *G11C 7/02* (2013.01);
(Continued)

(58) Field of Classification Search
None
See application file for complete search history.

(56) References Cited

U.S. PATENT DOCUMENTS

2018/0047327 A1* 2/2018 Wang ...................... G11C 19/28
2018/0335815 A1* 11/2018 Chen ......................... G06F 1/24
(Continued)

*Primary Examiner* — Tuan T Lam
(74) *Attorney, Agent, or Firm* — Myers Bigel, P.A.

(57) ABSTRACT

A shift register unit includes a first output control circuit, a first output circuit, a second output control circuit, a second output circuit, a reset circuit, and a node set circuit. The node set circuit is configured to periodically transfer a first voltage having an inactive level to a first node within the shift register unit during being enabled.

20 Claims, 10 Drawing Sheets

(51) Int. Cl.
*G09G 3/20* (2006.01)
*G11C 7/02* (2006.01)
*G09G 3/36* (2006.01)
*G09G 3/3266* (2016.01)

(52) U.S. Cl.
CPC .......... *G11C 19/28* (2013.01); *G09G 3/3266* (2013.01); *G09G 2300/0426* (2013.01); *G09G 2310/0286* (2013.01); *G09G 2310/08* (2013.01)

(56) References Cited

U.S. PATENT DOCUMENTS

| | | | |
|---|---|---|---|
| 2019/0096308 A1* | 3/2019 | Lv | G09G 3/3677 |
| 2019/0096500 A1* | 3/2019 | Gu | G11C 19/287 |
| 2019/0206294 A1* | 7/2019 | Tian | G09G 3/20 |
| 2019/0279588 A1* | 9/2019 | Kim | G09G 3/3677 |
| 2019/0378448 A1* | 12/2019 | Park | G09G 3/20 |
| 2020/0020266 A1* | 1/2020 | Feng | G11C 19/182 |
| 2020/0042153 A1* | 2/2020 | Yang | G09G 3/20 |
| 2020/0051507 A1* | 2/2020 | Feng | G11C 19/28 |
| 2020/0051655 A1* | 2/2020 | Dong | G09G 3/20 |

* cited by examiner

SHIFT REGISTER UNIT, DRIVING METHOD THEREOF, GATE DRIVE CIRCUIT, AND DISPLAY DEVICE

CROSS REFERENCE TO RELATED APPLICATIONS

The present application is a 35 U.S.C. 371 national stage application of PCT International Application No. PCT/CN2018/088957, filed on May 30, 2018, which claims the benefit of Chinese Patent Application No. 201710706066.6 filed Aug. 16, 2017, the contents of which are incorporated herein by reference in their entireties. The above-referenced PCT International Application was published in the Chinese language as International Publication No. WO 2019/033823 A1 on Feb. 21, 2019.

TECHNICAL FIELD

The present disclosure relates to the field of display technologies, and in particular, to a shift register unit, a driving method thereof, a gate drive circuit, and a display device.

BACKGROUND

A gate drive circuit of a display typically includes a plurality of cascaded shift register units, each of which is configured to output a gate scan signal to a respective one of gate lines in the display. A disturbance in the potential at some internal nodes within the shift register unit may cause an abnormality in the gate scan signal output by the shift register unit.

SUMMARY

According to an aspect of the present disclosure, a shift register unit is provided, comprising: a signal input terminal configured to receive an input signal; a first clock signal terminal configured to receive a first clock signal; a first voltage terminal configured to receive a first voltage having an inactive level; a reset signal terminal configured to receive a reset signal; a first control signal terminal configured to receive one of a second clock signal that is an inverted version of the first clock signal, or a second voltage having an active level; a second control signal terminal configured to receive one of the first clock signal or the second clock signal; a third control signal terminal configured to be connected to one of a first node, the signal input terminal, or a second node; a signal output terminal configured to output an output signal; a first output control circuit configured to transfer the input signal to the first node in response to the input signal being active; a first output circuit configured to transfer the first clock signal from the first clock signal terminal to the signal output terminal in response to a potential at the first node being active, and configured to cause a change in the potential at the first node in response to a change in a level of the output signal; a second output control circuit configured to bring the first control signal terminal into conduction with the second node in response to a potential at the first control signal terminal being active, and configured to transfer the first voltage from the first voltage terminal to the second node in response to the potential at the first node being active; a second output circuit configured to transfer the first voltage from the first voltage terminal to the first node and the signal output terminal in response to a potential at the second node being active; a reset circuit configured to transfer the first voltage from the first voltage terminal to the first node and the signal output terminal in response to the reset signal being active; and a node set circuit configured to be enabled depending on a potential at the third control signal terminal, and configured to, during being enabled, periodically transfer the first voltage from the first voltage terminal to the first node in response to a potential at the second control signal terminal alternately switching between an active level and an inactive level.

In some embodiments, the node set circuit comprises: a first transistor having a gate connected to the second control signal terminal, a first electrode connected to the first node, and a second electrode connected to the first voltage terminal; and a second transistor having a gate connected to the third control signal terminal, a first electrode connected to the second control signal terminal, and a second electrode connected to the first voltage terminal.

In some embodiments, the second control signal terminal is configured to receive the first clock signal, and the third control signal terminal is configured to be connected to the first node.

In some embodiments, the second control signal terminal is configured to receive the second clock signal, and the third control signal terminal is configured to be connected to the signal input terminal.

In some embodiments, the node set circuit comprises: a first transistor having a gate, a first electrode connected to the first node, and a second electrode connected to the first voltage terminal; and a second transistor having a gate connected to the third control signal terminal, a first electrode connected to the second control signal terminal, and a second electrode connected to the gate of the first transistor.

In some embodiments, the first control signal terminal is configured to receive the second voltage, the second control signal terminal is configured to receive the first clock signal, and the third control signal terminal is configured to be connected to the second node.

In some embodiments, the first control signal terminal is configured to receive the second clock signal, the second control signal terminal is configured to receive the second clock signal, and the third control signal terminal is configured to be connected to the second node.

In some embodiments, the first output control circuit comprises a third transistor having a gate connected to the signal input terminal, a first electrode connected to the signal input terminal, and a second electrode connected to the first node.

In some embodiments, the first output control circuit further comprises a thirteenth transistor having a gate connected to the first control signal terminal, a first electrode connected to the signal input terminal, and a second electrode connected to the first node.

In some embodiments, the first output circuit comprises: a drive transistor having a gate connected to the first node, a first electrode connected to the first clock signal terminal, and a second electrode connected to the signal output terminal; and a storage capacitor connected between the first node and the signal output terminal.

In some embodiments, the second output control circuit comprises: a fourth transistor having a gate connected to the first control signal terminal, a first electrode connected to the first control signal terminal, and a second electrode; a fifth transistor having a gate connected to the second electrode of the fourth transistor, a first electrode connected to the first control signal terminal, and a second electrode connected to the second node; a sixth transistor having a gate connected to the first node, a first electrode connected to the second node, and a second electrode connected to the first voltage terminal; and a seventh transistor having a gate connected to the first node, a first electrode connected to the second electrode of the fourth transistor, and a second electrode connected to the first voltage terminal.

In some embodiments, the second output circuit comprises: an eighth transistor having a gate connected to the second node, a first electrode connected to the first node, and a second electrode connected to the first voltage terminal; and a ninth transistor having a gate connected to the second node, a first electrode connected to the signal output terminal, and a second electrode connected to the first voltage terminal.

In some embodiments, the reset circuit comprises: a tenth transistor having a gate connected to the reset signal terminal, a first electrode connected to the first node, and a second electrode connected to the first voltage terminal; and an eleventh transistor having a gate connected to the reset signal terminal, a first electrode connected to the signal output terminal, and a second electrode connected to the first voltage terminal.

In some embodiments, the shift register unit further comprises an auxiliary output circuit configured to transfer the first voltage from the first voltage terminal to the signal output terminal in response to the potential at the first control signal terminal being active.

In some embodiments, the auxiliary output circuit comprises a twelfth transistor having a gate connected to the first control signal terminal, a first electrode connected to the signal output terminal, and a second electrode connected to the first voltage terminal.

In some embodiments, the second transistor is designed to have a faster response speed than that of the first transistor.

According to another aspect of the present disclosure, a gate drive circuit is provided comprising a plurality of cascaded shift register units as described above. The signal input terminal of a first one of the plurality of cascaded shift register units is configured to receive a start signal as the input signal. The signal output terminal of each of the plurality of cascaded shift register units, except for a last one of the plurality of cascaded shift register units, is connected to the signal input terminal of an adjacent next one of the plurality of cascaded shift register units. The signal output terminal of each of the plurality of cascaded shift register units, except for the first one of the plurality of cascaded shift register units, is connected to the reset signal terminal of an adjacent previous one of the plurality of cascaded shift register units.

According to another aspect of the present disclosure, a display device is provided comprising the gate drive circuit as described above.

According to another aspect of the present disclosure, a method is provided for driving the shift register unit as described above. The method comprises: performing a first phase in which the first output control circuit transfers the input signal to the first node in response to the input signal being active, the first output circuit transfers the first clock signal from the first clock signal terminal to the signal output terminal in response to the potential at the first node being active, and the second output control circuit brings the first control signal terminal into conduction with the second node in response to the potential at the first control signal terminal being active; performing a second phase in which the first output circuit transfers the first clock signal from the first clock signal terminal to the signal output terminal in response to the potential at the first node being active, and the second output control circuit transfers the first voltage from the first voltage terminal to the second node in response to the potential at the first node being active; and performing a third phase in which the reset circuit transfers the first voltage from the first voltage terminal to the first node and the signal output terminal in response to the reset signal being active, the second output control circuit brings the first control signal terminal into conduction with the second node in response to the potential at the first control signal terminal being active, and the second output circuit transfers the first voltage from the first voltage terminal to the first node and the signal output terminal in response to the potential at the second node being active.

In some embodiments, the method further comprises: enabling the node set circuit after the third phase, and periodically transferring, by the node set circuit during being enabled, the first voltage from the first voltage terminal to the first node in response to the potential at the second control signal terminal alternately switching between an active level and an inactive level.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1A:
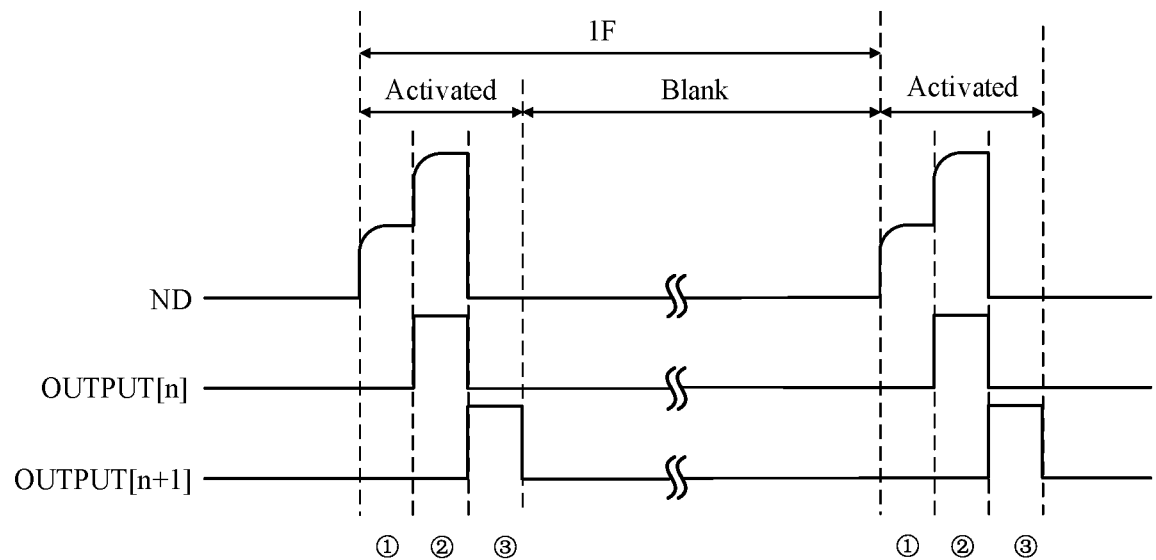
FIG. 1A is an example timing diagram of a shift register unit according to related art.
Figure 1B:
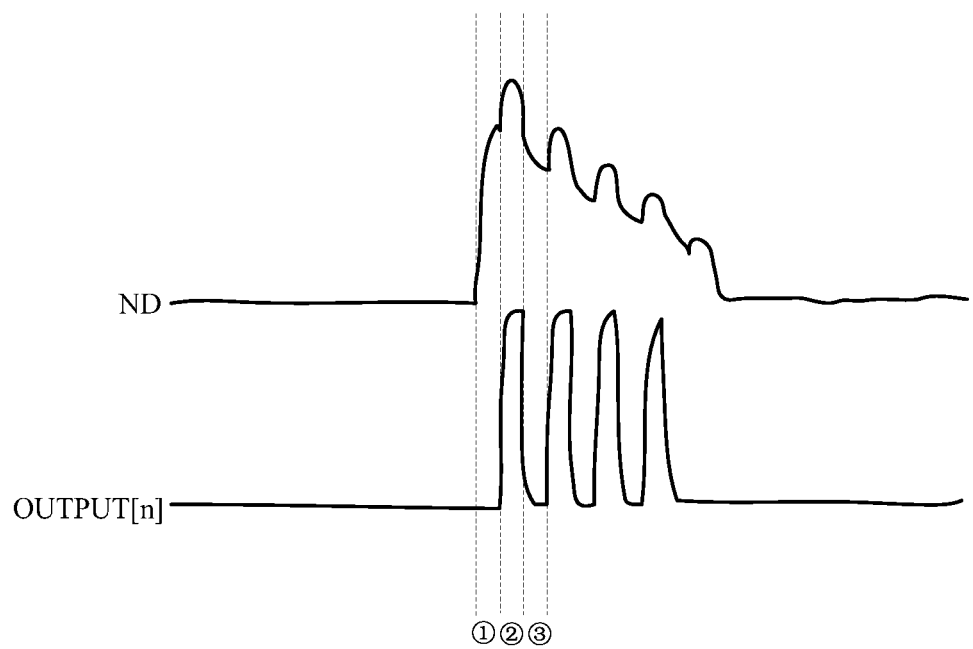
FIG. 1B is a schematic diagram showing how a potential at a node of a shift register unit affects an output signal of the shift register unit.

FIG. 1A shows an example timing diagram of a shift register unit in accordance with related art. As shown in FIG. 1A, ND indicates an internal node of the shift register unit, OUTPUT[n] indicates an output terminal of the shift register unit connected to an n-th gate line, and OUTPUT[n+1] indicates an output terminal of a next shift register unit connected to an (n+1)-th gate line. The shift register unit is configured to output a gate scan signal (a high level pulse in this example) based on a potential at the internal node ND during an activated period of the frame period 1F, and does not output the gate scan signal during a blanking period of the frame period 1F. In particular, in a third phase of the activated period, the potential at the internal node ND needs to be pulled down to a low level to stop the scanning of the n-th gate line. At this time, the shift register unit connected to the (n+1)-th gate line outputs a gate scan signal at its output terminal OUTPUT[n+1]. However, the shift register unit will output an abnormal gate scan signal at its output terminal OUTPUT[n] if the potential at the internal node ND is not sufficiently pulled low in the third phase, as shown in FIG. 1B. This can result in abnormal operation of the display.

Figure 2:
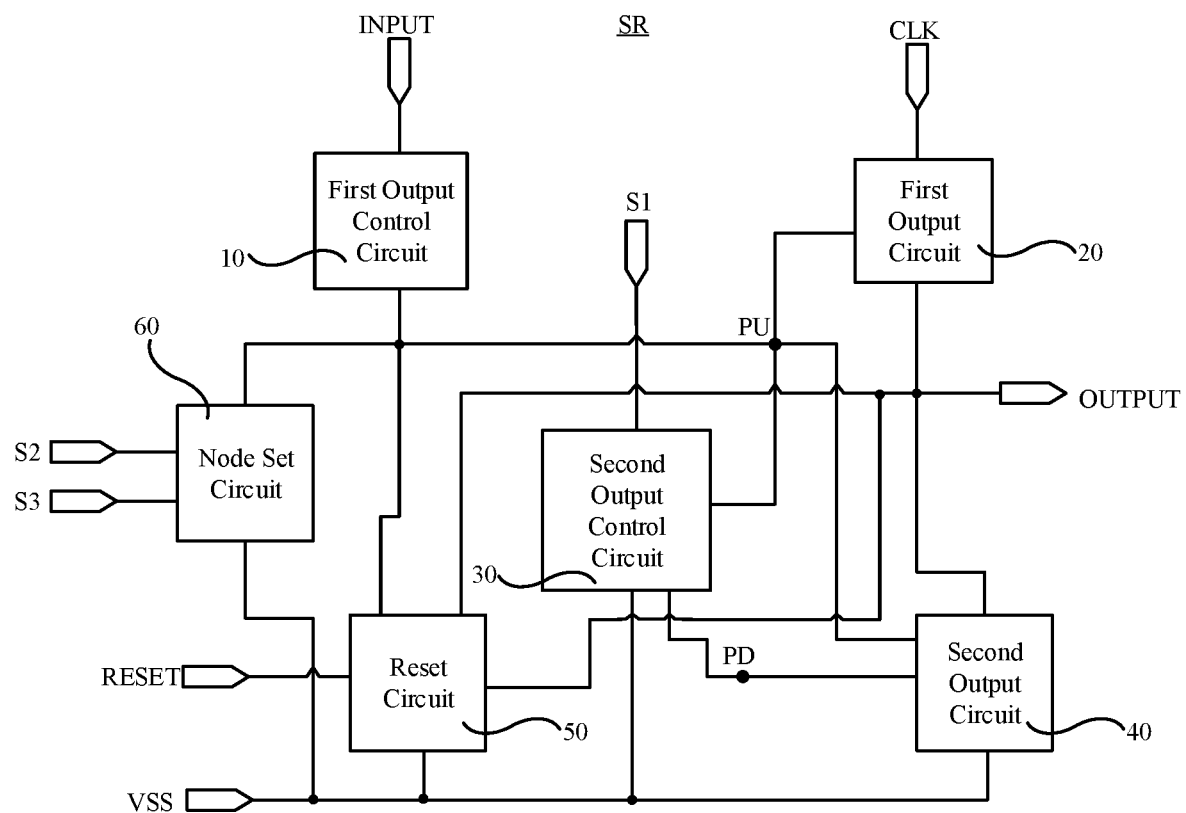
FIG. 2 is a schematic block diagram of a shift register unit in accordance with an embodiment of the present disclosure.

FIG. 2 is a schematic block diagram of a shift register unit SR in accordance with an embodiment of the present disclosure. As shown in FIG. 2, the shift register unit SR includes a first output control circuit 10, a first output circuit 20, a second output control circuit 30, a second output circuit 40, a reset circuit 50, and a node set circuit 60.

The first output control circuit 10 is connected to a first node PU as an internal node and a signal input terminal INPUT for receiving an input signal. The first output control circuit 10 is configured to transfer the input signal to the first node PU in response to the input signal being active.

The first output circuit 20 is connected to a first clock signal terminal CLK for receiving a first clock signal, the first node PU, and a signal output terminal OUTPUT for outputting an output signal. The first output circuit 20 is configured to transfer the first clock signal from the first clock signal terminal CLK to the signal output terminal OUTPUT in response to a potential at the first node PU being active. The first output circuit 20 is further configured to cause a change in the potential at the first node PU in response to a change in a level of the output signal.

The second output control circuit 30 is connected to a first control signal terminal S1, the first node PU, a second node PD, and a first voltage terminal VSS for receiving a first voltage having an inactive level. As will be described later, the first control signal terminal is configured to receive one of (i) a second clock signal CLKB that is an inverted version of the first clock signal or (ii) a second voltage VDD having an active level. The second output control circuit 30 is configured to bring the first control signal terminal S1 into conduction with the second node PD in response to a potential at the first control signal terminal S1 being active. The second output control circuit 30 is further configured to transfer the first voltage from the first voltage terminal VSS to the second node PD in response to the potential at the first node PU being active.

The second output circuit 40 is connected to the second node PD, the first node PU, the signal output terminal OUTPUT, and the first voltage terminal VSS. The second output circuit 40 is configured to transfer the first voltage from the first voltage terminal VSS to the first node PU and the signal output terminal OUTPUT in response to a potential at the second node PD being active.

The reset circuit 50 is connected to a reset signal terminal RESET for receiving a reset signal, the first node PU, the signal output terminal OUTPUT, and the first voltage terminal VSS. The reset circuit 50 is configured to transfer the first voltage from the first voltage terminal VSS to the first node PU and the signal output terminal OUTPUT in response to the reset signal being active.

The node setting circuit 60 is connected to the first node PU, a second control signal terminal S2, a third control signal terminal S3, and the first voltage terminal VSS. As will be described later, the second control signal terminal S2 is configured to receive one of (i) the first clock signal or (ii) the second clock signal, and the third control signal terminal S3 is configured to be connected to one of (i) the first node PU, (ii) the signal input terminal INPUT, or (iii) the second node PD. The node set circuit 60 is configured to be enabled depending on a potential at the third control signal terminal S3, and to periodically transfer the first voltage from the first voltage terminal VSS to the first node PU during being enabled in response to a potential at the second control signal terminal S2 alternately switching between an active level and an inactive level.

Due to the presence of the node set circuit 60, the potential at the first node PU is periodically set to the first voltage with an inactive level that is received via the first voltage terminal VSS, thereby providing noise reduction for the first node PU. This may avoid fluctuations in the potential at the first node PU as shown in FIG. 1B. In the application scenario of gate driving, this in turn prevents the shift register unit SR from outputting an abnormal gate scan signal as shown in FIG. 1B at the signal output terminal OUTPUT.

The term "active potential" or "active level" as used herein refers to a potential at which a circuit component (e.g., a transistor) involved is enabled, and the term "inactive potential" or "inactive level" as used herein refers to a potential at which the circuit component involved is disabled. For an N-type transistor, the active potential is high and the inactive potential is low. For a P-type transistor, the active potential is low and the inactive potential is high. It will be understood that the active potential or the inactive potential is not intended to refer to a particular potential, but may include a range of potentials.

Figure 3:
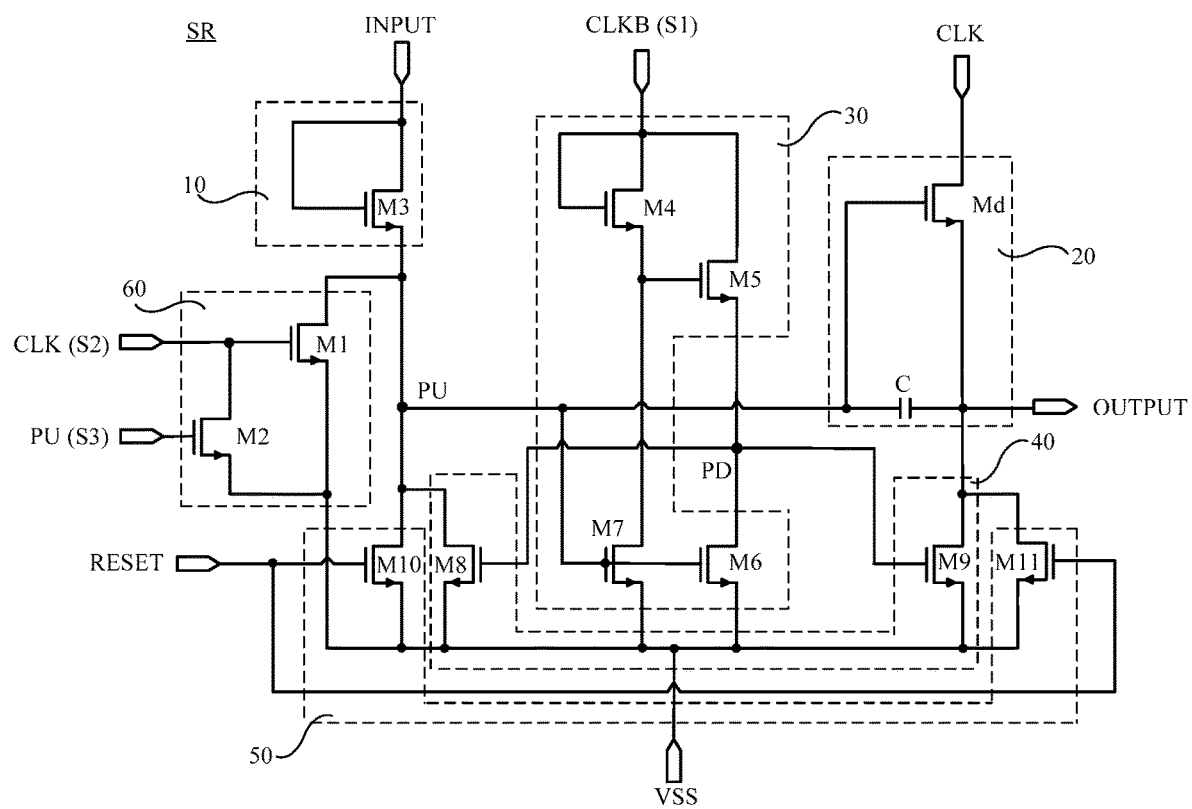
FIG. 3 is a schematic diagram of an example circuit of the shift register unit of FIG. 2.

FIG. 3 is a schematic diagram of an example circuit of the shift register unit SR of FIG. 2. As shown in FIG. 3, the first control signal terminal S1 is configured to receive the second clock signal CLKB, which is an inverted version of the first clock signal received via the first clock signal terminal CLK. The second control signal terminal is configured to receive the first clock signal. Although not shown, in some embodiments the second control signal terminal S2 may be directly connected to the first clock signal terminal CLK. The third control signal terminal S3 is configured to be connected to the first node PU. In the example of FIG. 3, the circuit connection between the third control signal terminal S3 and the first node PU is not shown, and instead the third control signal terminal S3 is denoted by the same reference numeral "PU" as the first node.

The node set circuit 60 includes a first transistor M1 and a second transistor M2. The first transistor M1 has a gate connected to the second control signal terminal S2, a first electrode connected to the first node PU, and a second electrode connected to the first voltage terminal VSS. The second transistor M2 has a gate connected to the third control signal terminal S3, a first electrode connected to the second control signal terminal S2, and a second electrode connected to the first voltage terminal VSS. In some embodiments, the second transistor M2 is designed to have a faster response speed than that of the first transistor M1. For example, the size of the first transistor M1 may be smaller than the size of the second transistor M2. Thus, the second transistor M2 is turned on before the first transistor M1 when the gates of the first transistor M1 and the second transistor M2 are both supplied with an active level.

The first output control circuit 10 includes a third transistor M3. The third transistor M3 has a gate and a first electrode that are connected to the signal input terminal INPUT, and a second electrode connected to the first node PU.

The first output circuit 20 includes a drive transistor Md and a storage capacitor C. The drive transistor Md has a gate connected to the first node PU, a first electrode connected to the first clock signal terminal CLK, and a second electrode connected to the signal output terminal OUTPUT. The drive transistor Md is designed to have a certain driving capability such that the signal output terminal OUTPUT connected to the second electrode of the drive transistor Md can drive the pixel transistors of one row of sub-pixels to be turned on. For this purpose, the above-described drive transistor Md may have a larger size with respect to other switching transistors (e.g., the first to third transistors M1, M2, and M3). Further, the storage capacitor C has one terminal connected to the gate of the drive transistor Md and another terminal connected to the second electrode of the drive transistor Md.

The second output control circuit 30 includes a fourth transistor M4, a fifth transistor M5, a sixth transistor M6, and a seventh transistor M7. The fourth transistor M4 has a gate and a first electrode that are connected to the first control signal terminal S1, and a second electrode connected to the gate of the fifth transistor M5. The fifth transistor M5 has a first electrode connected to the first control signal terminal S1 and a second electrode connected to the second node PD. The sixth transistor M6 has a gate connected to the first node PU, a first electrode connected to the second node PD, and a second electrode connected to the first voltage terminal VSS. The seventh transistor M7 has a gate connected to the first node PU, a first electrode connected to the second electrode of the fourth transistor M4, and a second electrode connected to the first voltage terminal VSS.

The second output circuit 40 includes an eighth transistor M8 and a ninth transistor M9. The eighth transistor M8 has a gate connected to the second node PD, a first electrode connected to the first node PU, and a second electrode connected to the first voltage terminal VSS. The ninth transistor M9 has a gate connected to the second node PD, a first electrode connected to the signal output terminal OUTPUT, and a second electrode connected to the first voltage terminal VSS.

The reset circuit 50 includes a tenth transistor M10 and an eleventh transistor M11. The tenth transistor M11 has a gate connected to the reset signal terminal RESET, a first electrode connected to the first node PU, and a second electrode connected to the first voltage terminal VSS. The eleventh transistor M11 has a gate connected to the reset signal terminal RESET, a first electrode connected to the signal output terminal OUTPUT, and a second electrode connected to the first voltage terminal VSS.

Figure 4:
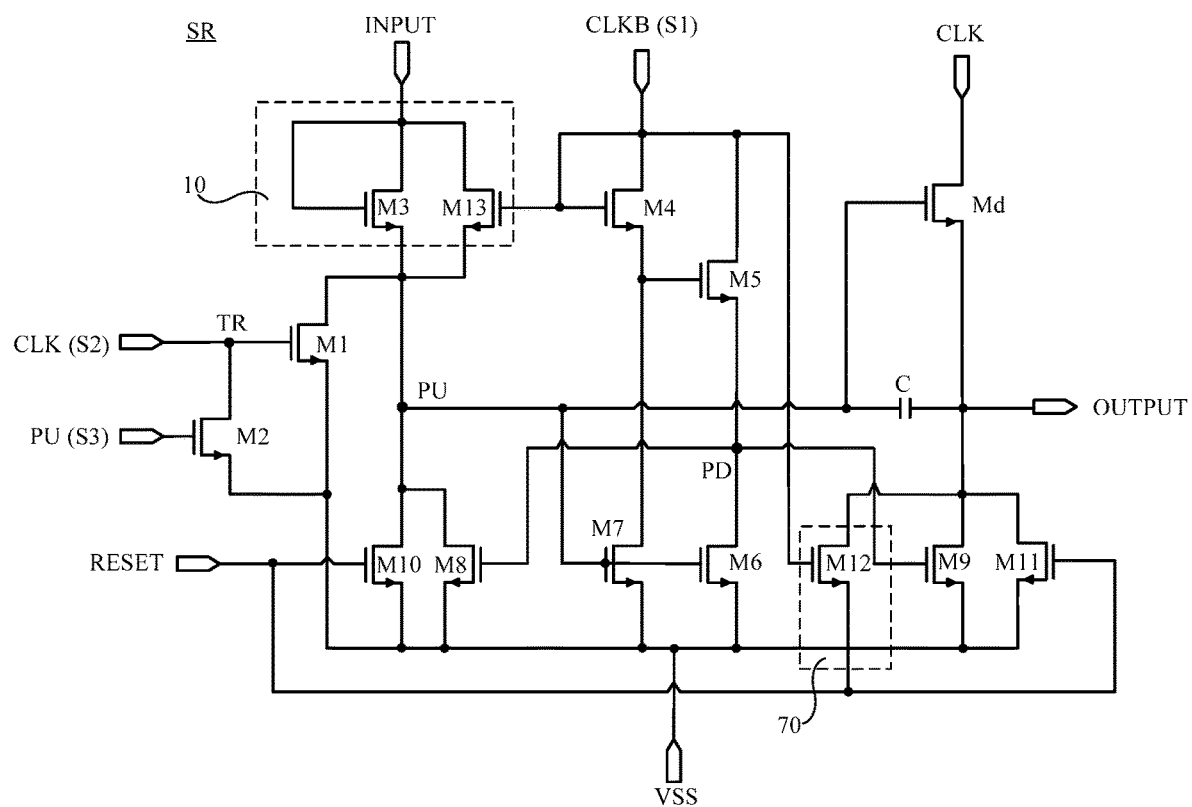
FIG. 4 is a schematic diagram of another example circuit of the shift register unit of FIG. 2.

FIG. 4 is a schematic diagram of another example circuit of the shift register unit SR of FIG. 2. Unlike the example of FIG. 3, the shift register unit SR shown in FIG. 4 further includes an auxiliary output circuit 70. The auxiliary output circuit 70 is connected to the first control signal terminal S1, the signal output terminal OUTPUT, and the first voltage terminal VSS. The auxiliary output circuit 70 is configured to transfer the first voltage from the first voltage terminal VSS to the signal output terminal OUTPUT in response to the potential at the first control signal terminal S1 being active. This may provide an auxiliary noise reduction for the signal output terminal OUTPUT, avoiding undesired fluctuations in the potential at the signal output terminal OUTPUT. Specifically, the auxiliary output circuit 70 includes a twelfth transistor M12 having a gate connected to the first control signal terminal S1, a first electrode connected to the signal output terminal OUTPUT, and a second electrode connected to the first voltage terminal VSS.

In this example, the first output control circuit 10 further includes a thirteenth transistor M13 having a gate connected to the first control signal terminal S1, the first electrode connected to the signal input terminal INPUT, and a second electrode connected to the first node PU. The thirteenth transistor M13 can provide additional robustness. For example, in the case where the third transistor M3 is damaged, the active signal received by the signal input terminal INPUT can be transferred to the first node PU through the thirteenth transistor M13, thereby ensuring that the first node PU can be normally charged. Moreover, since the second clock signal CLKB received by the first control signal terminal S1 alternately switches between the active level and the inactive level, the inactive signal received by the signal input terminal INPUT can be periodically transferred to the first node PU, thereby providing additional noise reduction for the first node PU.

Figure 5:
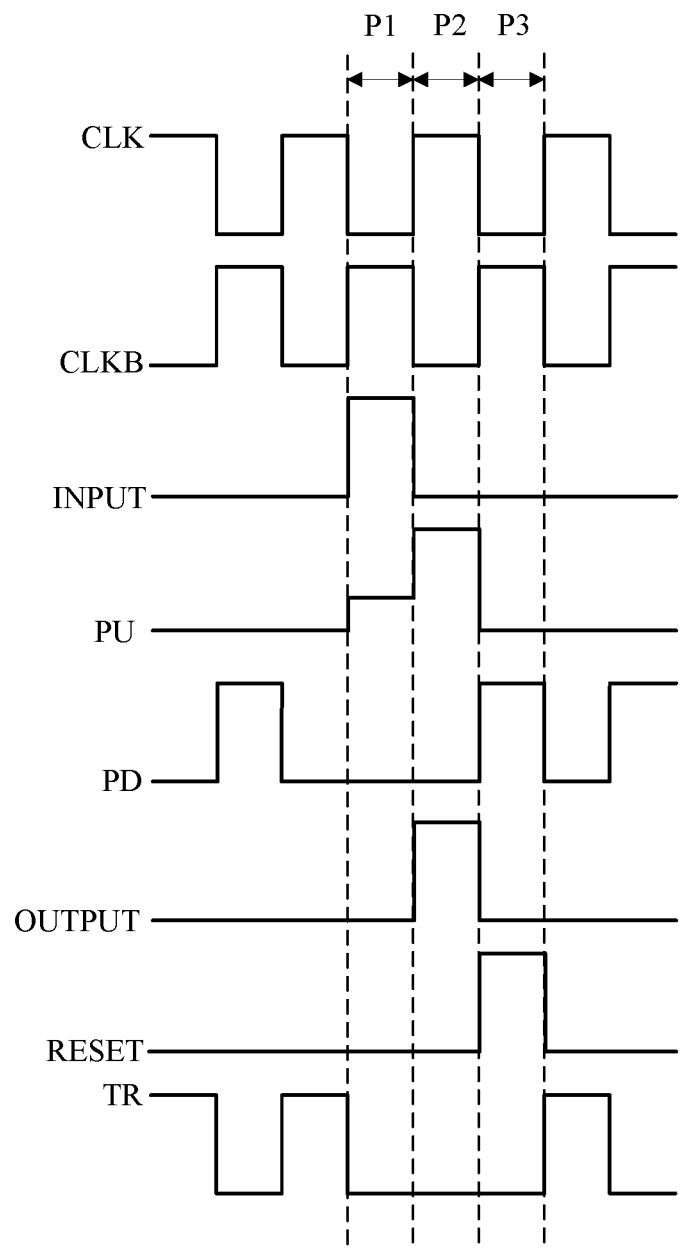
FIG. 5 is an example timing diagram for the example circuit of FIG. 3 or FIG. 4.

FIG. 5 is an example timing diagram for the example circuit of FIG. 3 or 4. The operation of the shift register unit shown in FIG. 4 will be described in detail below with reference to FIG. 5.

In a first phase P1, CLK=0, CLKB=1, INPUT=1, RESET=0, and OUTPUT=0, wherein "0" indicates an inactive level (low in this example), and "1" indicates an active level (high in this example).

The third transistor M3 and the thirteenth transistor M13 are turned on, and transfer the high level of the signal input terminal INPUT to the first node PU to charge the first node PU, causing the potential at the first node PU to gradually rise. In some embodiments, to ensure that the first node PU can be charged, the third transistor M3 is designed to have an increased response speed. For example, the size of the third transistor M3 may be smaller than the size of the drive transistor Md and larger than the sizes of the remaining switching transistors.

The storage capacitor C stores the voltage transferred to the first node PU. As the potential at the first node PU gradually rises, the drive transistor Md is turned on to transfer the low level of the first clock signal input terminal CLK to the signal output terminal OUTPUT. In addition, the second transistor M2 is turned on to pull the potential at the gate of the first transistor M1 (i.e., the node TR) down to an inactive level of the first voltage terminal VSS. Therefore, the first transistor M1 is not turned on to pull the potential of the first node PU low.

In response to the high potential at the first node PU, the sixth transistor M6 and the seventh transistor M7 are turned on. Even if the second clock signal input terminal CLKB outputs a high level to turn on the fourth transistor M4, the turned-on seventh transistor M7 will still pull the potential at the second electrode of the fourth transistor M4 and the potential at the gate of the fifth transistor M5 down to the inactive level of the first voltage terminal VSS. Therefore, the fifth transistor M5 is not turned on, so that the high level of the second clock signal CLKB received via the first control signal terminal S1 cannot be transferred to the second node PD through the fifth transistor M5. The second node PD is at a low level. Since the sixth transistor M6 is turned on, the potential at the second node PD is pulled down to an inactive level of the first voltage terminal VSS. In this case, both the eighth transistor M8 and the ninth transistor M9 are in an off state. Further, both the tenth transistor M10 and the eleventh transistor M11 are in an off state since the reset signal terminal RESET is at a low level.

In response to the high level of the second clock signal CLKB, the twelfth transistor M12 is turned on to pull the potential at the signal output terminal OUTPUT down to an inactive level of the first voltage terminal VSS. In this way, the signal output terminal OUTPUT is noise-reduced before outputting an output signal.

In a second phase P2, CLK=1, CLKB=0, INPUT=0, RESET=0, and OUTPUT=1.

The third transistor M3 is in an off state, and the thirteenth transistor M13, the fourth transistor M4, and the fifth transistor M5 are also in an off state due to the low level of the second clock signal CLKB. The voltage stored by the storage capacitor C maintains the first node PU at a high level, so that the drive transistor Md remains in an on state. The high level of the first clock signal input terminal CLK is transferred to the signal output terminal OUTPUT through the drive transistor Md. Due to the self-boosting effect of the storage capacitor C, the potential at the first node PU is further increased. Although the first node PU and the first clock signal terminal CLK are both at a high level, the second transistor M2 is turned on before the first transistor M1 because the second transistor M2 has a faster response speed than that of the first transistor M1. Therefore, the potential at the gate of the first transistor M1 (i.e., the node TR) is pulled down to the inactive level of the first voltage terminal VSS, thereby ensuring that the first transistor M1 is not turned on to pull the potential at the first node PU low. That is, the node set circuit 60 does not affect the potential at the first node PU in the first and second phases P1 and P2.

In addition, the sixth transistor M6, the seventh transistor M7, the eighth transistor M8, the ninth transistor M9, the tenth transistor M10, and the eleventh transistor M11 are in an on state as in the first phase P1, and details are not described herein again.

In a third phase P3, CLK=0, CLKB=1, INPUT=0, RESET=1, and OUTPUT=0.

The tenth transistor M10 and the eleventh transistor M11 are turned on to reset the first node PU and the signal output terminal OUTPUT. Specifically, the potential at the first node PU is pulled down to the inactive level of the first voltage terminal VSS through the tenth transistor M10, and the potential at the signal output terminal OUTPUT is pulled down to the inactive level of the first voltage terminal VSS through the eleventh transistor M11.

The fourth transistor M4 is turned on to transfer the high level of the second clock signal CLKB to the gate of the fifth transistor M5. The fifth transistor M5 is turned on, so that the high level of the second clock signal CLKB is transferred to the second node PD through the fifth transistor M5, rendering the second node PD at a high level.

In response to the high level at the second node PD, the eighth transistor M8 and the ninth transistor M9 are turned on. The potential at the first node PU is pulled down to the inactive level of the first voltage terminal VSS through the eighth transistor M8, and the potential at the signal output terminal OUTPUT is pulled down to the inactive level of the first voltage terminal VSS through the ninth transistor M9. Since the potential at the first node PU is pulled low, the drive transistor Md, the sixth transistor M6, and the seventh transistor M7 are turned off.

After the third phase P3 described above, the node set circuit 60 is enabled. Specifically, since the third control signal terminal S3 (i.e., the first node PU) is at a low level, the second transistor M2 is turned off, and the node TR is not limited to a low level, thereby allowing the first transistor M1 to act in response to the potential at the second control signal terminal S2. In the example of FIG. 4, the second control signal terminal S2 is configured to receive the first clock signal CLK. As the first clock signal CLK alternately switches between a high level and a low level, the first transistor M1 is periodically turned on to periodically transfer the first voltage from the first voltage terminal VSS to the first node PU. In this way, the first node PU is noise-reduced, thereby avoiding undesired fluctuations in the potential at the first node PU.

Further, the twelfth transistor M12 is periodically turned on in response to the second clock signal CLKB alternately switching between a high level and a low level. Advantageously, this provides noise reduction for the signal output terminal OUTPUT.

Figure 6:
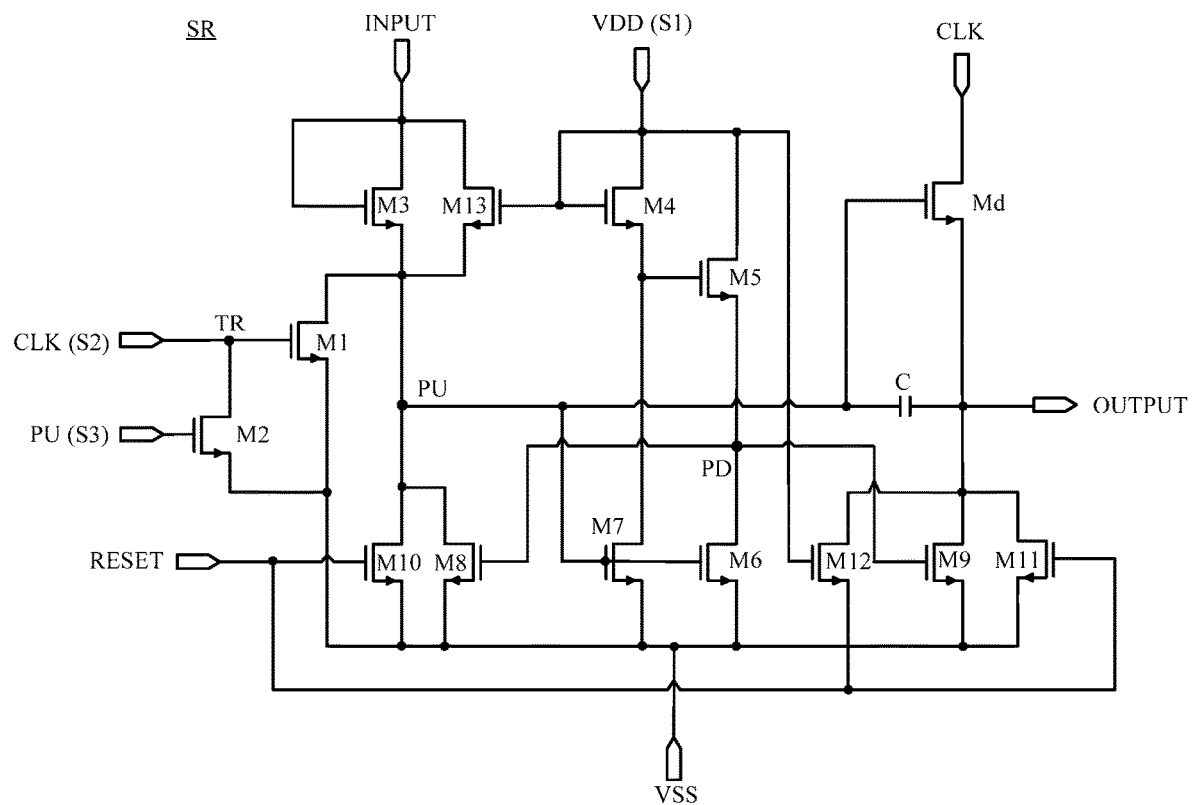
FIG. 6 is a schematic diagram of a variation of the example circuit of FIG. 4.

FIG. 6 is a schematic diagram of a variation of the example circuit of FIG. 4. In this example, as shown in FIG. 6, the first control signal terminal S1 is configured to receive a second voltage VDD having an active level.

The operation of the shift register unit SR shown in FIG. 6 is similar to those described above, and still includes a first phase P1, a second phase P2, and a third phase P3.

In the first phase P1 and the second phase P2, although the second voltage VDD keeps the fourth transistor M4 turned on, the fifth transistor M5 does not conduct. This is because the seventh transistor M7 is turned on due to the high level at the first node PU in the first phase P1 and the second phase P2. The turned-on seventh transistor M7 pulls down the potential at the gate of the fifth transistor M5 to the inactive level of the first voltage terminal VSS. In this way, the second node PD remains at a low level in the first phase P1 and the second phase P2.

In the third phase P3, the seventh transistor M7 and the sixth transistor M6 are in an off state since the first node PU is at a low level. At this time, the high level of the second voltage VDD can be transferred to the gate of the fifth transistor M5 through the fourth transistor M4, thereby turning on the fifth transistor M5. In this way, the high level of the second voltage VDD can be transferred to the second node PD through the fifth transistor M5, rendering the second node PD at a high level in the third phase P3.

Since the second voltage VDD is at a constant high level, the second node PD remains at a high level after the third phase P3. In response to the high level at the second node PD, the eighth transistor M8 and the ninth transistor M9 respectively denoise the first node PU and the signal output terminal OUTPUT.

Figure 7:
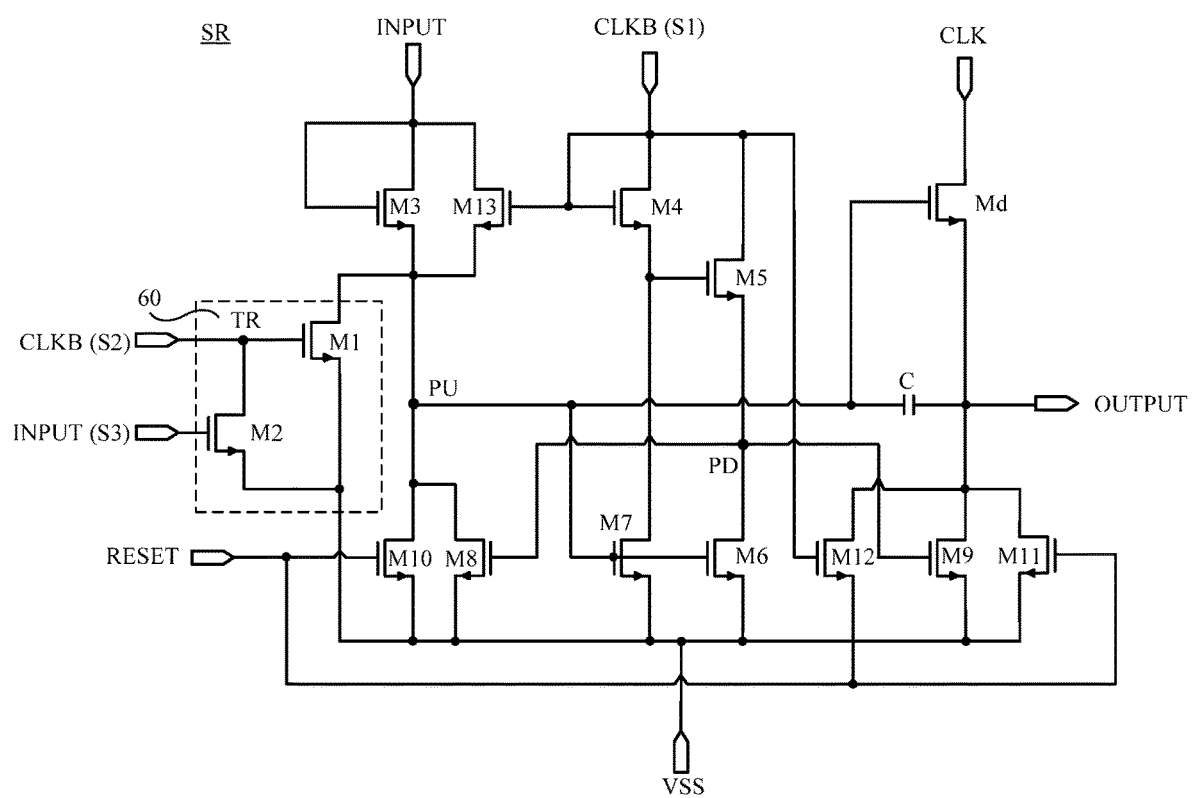
FIG. 7 is a schematic diagram of another variation of the example circuit of FIG. 4.

FIG. 7 is a schematic diagram of another variation of the example circuit of FIG. 4. As shown in FIG. 7, the first control signal terminal S1 is configured to receive the second clock signal CLKB, the second control signal terminal S2 is configured to receive the second clock signal CLKB, and the third control signal terminal S3 is configured to be connected to the signal input terminal INTPUT. In the example of FIG. 7, the circuit connection between the third control signal terminal S3 and the signal input terminal INTPUT is not shown, and instead the third control signal terminal S3 is denoted by the same reference numeral "INTPUT" as the signal input terminal.

The node set circuit 60 includes a first transistor M1 and a second transistor M2. The first transistor M1 has a gate connected to the second control signal terminal S2, a first electrode connected to the first node PU, and a second electrode connected to the first voltage terminal VSS. The second transistor M2 has a gate connected to the third control signal terminal S3, a first electrode connected to the second control signal terminal S2, and a second electrode connected to the first voltage terminal VSS. As previously mentioned, the first transistor M1 can have a faster response speed than that of the second transistor M2.

The operation of the shift register unit SR shown in FIG. 7 is similar to those described above, and still includes a first phase P1, a second phase P2, and a third phase P3.

In the first phase P1, the second clock signal CLKB is high and the signal input terminal INPUT is at a high level. Since the response speed of the second transistor M2 is greater than the response speed of the first transistor M1, the second transistor M2 is turned on before the first transistor M1. The turned-on second transistor M2 pulls down the potential at the gate of the first transistor M1 to the inactive level of the first voltage terminal VSS. Therefore, the first transistor M1 is turned off so that the potential at the first node PU is not pulled low.

In the second phase P2, the second clock signal CLKB is low and the signal input terminal INPUT is at a low level. The first transistor M1 and the second transistor M2 are turned off.

In the third phase P3, the second clock signal CLKB is high and the signal input terminal INPUT is at a low level. The first transistor M1 is turned on and the second transistor M2 is turned off. The turned-on first transistor M1 pulls down the potential at the first node PU to the inactive level of the first voltage terminal VSS.

After the third phase P3, the signal input terminal INPUT remains at a low level, and thus the second transistor M2 is turned off. The second clock signal CLKB received at the second control signal terminal S2 alternately switches between an active level and an inactive level, so that the first transistor M1 is periodically turned on. Thus, the potential at the first node PU is periodically pulled down to the inactive level of the first voltage terminal VSS. The first node PU is therefore periodically denoised.

It will be understood that although not shown, in other embodiments the first control signal terminal S1 can be configured to receive the second voltage VDD.

Figure 8:
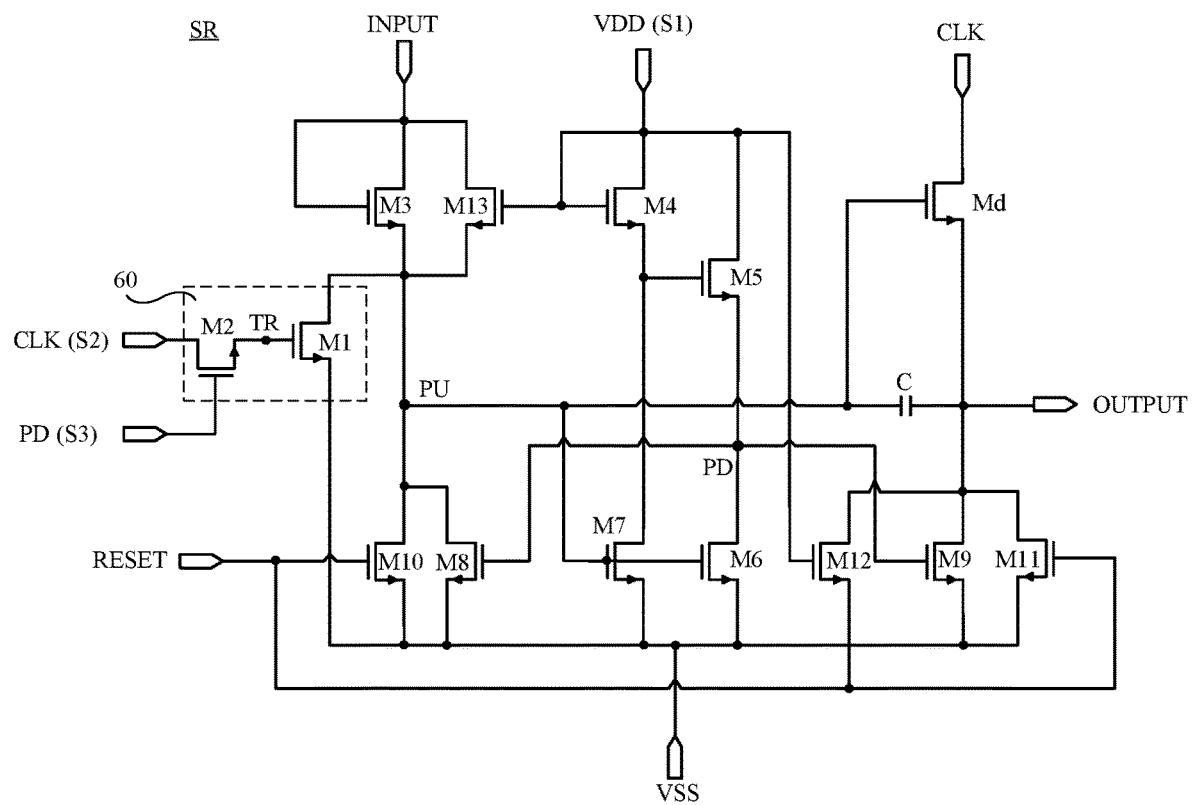
FIG. 8 is a schematic illustration of yet another variation of the example circuit of FIG. 4.

FIG. 8 is a schematic diagram of yet another variation of the example circuit of FIG. 4. As shown in FIG. 8, the first control signal terminal S1 is configured to receive the second voltage VDD, and the second control signal terminal S2 is configured to receive the first clock signal. Although not shown, in some embodiments the second control signal terminal S2 may be directly connected to the first clock signal terminal CLK. The third control signal terminal S3 is configured to be connected to the second node PD. In the example of FIG. 8, the circuit connection between the third control signal terminal S3 and the second node PD is not shown, and instead the third control signal terminal S3 is denoted by the same reference numeral "PD" as the second node.

The node set circuit 60 includes a first transistor M1 and a second transistor M2. The first transistor M1 has a gate connected to the node TR, a first electrode connected to the first node PU, and a second electrode connected to the first voltage terminal VSS. The second transistor M2 has a gate connected to the third control signal terminal S3, a first electrode connected to the second control signal terminal S2, and a second electrode connected to the node TR. As previously mentioned, the first transistor M1 may have a faster response speed than that of the second transistor M2.

The operation of the shift register unit SR shown in FIG. 8 is similar to those described above, and still includes a first phase P1, a second phase P2, and a third phase P3.

In the first phase P1, the first clock signal terminal CLK and the second node PD are at a low level, and the first transistor M1 and the second transistor M2 are turned off.

In the second phase P2, the first clock signal terminal CLK is at a high level, and the second node PD is at a low level. The second transistor M2 is turned off, and thus the high level of the first clock signal terminal CLK cannot be transferred to the gate of the first transistor M1 through the second transistor M2. Therefore, the first transistor M1 is kept in an off state.

In the third phase P3, the first clock signal terminal CLK is at a low level, and the second node PD is at a high level. The second transistor M2 is turned on, and the first transistor M1 is kept in an off state.

After the third phase P3, the second node PD is at a high level, and thus the second transistor M2 remains in an on state. The turned-on second transistor M2 periodically transfers the high level of the first clock signal received at the second control signal terminal S2 to the node TR, so that the first transistor M1 is periodically turned on. Therefore, the potential at the first node PU is periodically pulled down to the inactive level of the first voltage terminal VSS. In this way, the first node PU is periodically denoised.

It will be understood that although not shown, in other embodiments both the first control signal terminal S1 and the second control signal terminal S2 may be configured to receive the second clock signal CLKB.

Although transistors are illustrated and described as N-type transistors in the embodiments, P-type transistors are possible. The transistors may be of any suitable type, such as an enhanced type, a depleted type, and the like. In addition, these transistors can be fabricated with any suitable process, such as an a-Si process, an oxide semiconductor process, an LTPS (low temperature poly-silicon) process, an HTPS (high temperature poly-silicon) process, and so on.

Figure 9:
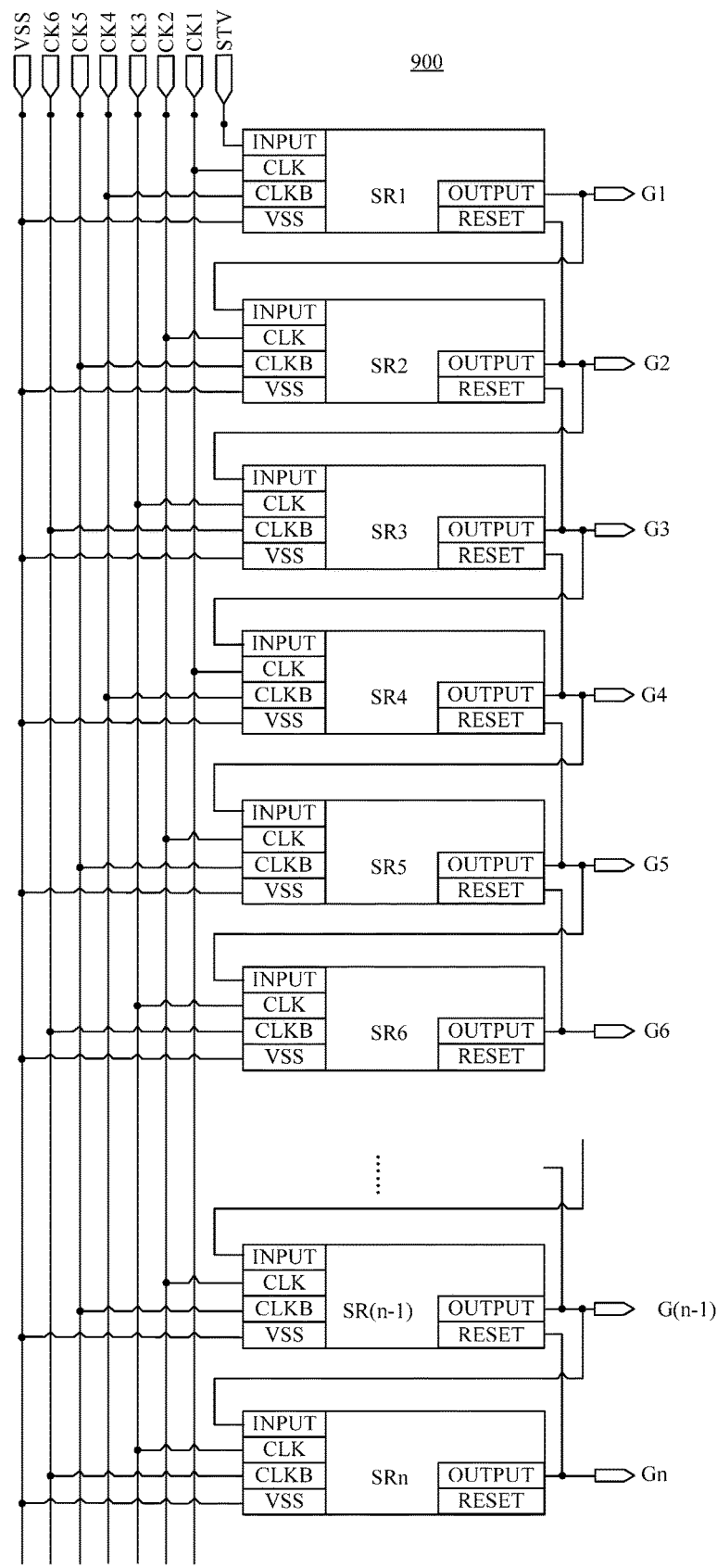
FIG. 9 is a schematic block diagram of a gate drive circuit in accordance with an embodiment of the present disclosure.

FIG. 9 is a schematic block diagram of a gate drive circuit 900 in accordance with an embodiment of the present disclosure. As shown in FIG. 9, the gate drive circuit 900 includes n cascaded shift register units SR1, SR2, SR3, SR4, SR5, SR6, . . . , SR(n-1), and SRn, where n is a positive integer and n≥2. Each of these shift register units may take the form of the shift register unit SR as described above with respect to FIG. 3, 4 or 7. In other embodiments, these shift register units may take other forms, such as the shift register unit SR described above with respect to FIG. 6 or 8.

The signal input terminal INPUT of the first stage shift register unit SR1 is configured to receive a start signal STV. The start signal STV is supplied to the gate drive circuit 900 at the beginning of each frame. Except for the last stage shift register unit SRn, the signal output terminal OUTPUT of each shift register unit is connected to the signal input terminal INPUT of an adjacent next stage shift register unit. Except for the first stage shift register unit SR1, the signal output terminal OUTPUT of each shift register unit is connected to the reset signal terminal RESET of an adjacent previous stage shift register unit.

The shift register units SR1, SR2, SR3, SR4, SR5, SR6, . . . , SR(n-1), and SRn can output respective gate scan signals to the gate lines G1, G2, G3, G4, G5, G6, . . . , G(n-1), and Gn. In some embodiments, the last stage shift register unit SRn serves as a dummy unit whose output signal is not used as a gate scan signal. Alternatively or additionally, the reset signal terminal RESET of the shift register unit SRn may be supplied with a reset signal generated by a dedicated circuit.

In the example of FIG. 9, the gate drive circuit 900 is supplied with six clock signals CLK1, CLK2, CLK3, CLK4, CLK5, and CLK6. Specifically, the shift register unit SR1 is supplied with clock signals CLK1 and CLK4 which are inverted from each other, the shift register unit SR2 is supplied with clock signals CLK2 and CLK5 which are inverted from each other, and the shift register unit SR3 is supplied with clock signals CLK3 and CLK6 which are inverted from each other. The clock configuration of the shift register unit SR4 is the same as that of the shift register unit SR1, the clock configuration of the shift register unit SR5 is the same as that of the shift register unit SR2, and the clock configuration of the shift register unit SR6 is the same as that of the shift register unit SR3. The clock configuration of the remaining shift register units is periodically repeated as described above. In other embodiments, the gate drive circuit 900 may have other clock configurations, such as being supplied with 8 clock signals or even 10 clock signals. An appropriate clock configuration can be determined by those skilled in the art based on the load of the gate drive circuit 900 and the required refresh rate.

The gate drive circuit 900 has the same advantages as those of the foregoing shift register unit embodiments, and will not be described in detail herein.

Figure 10:
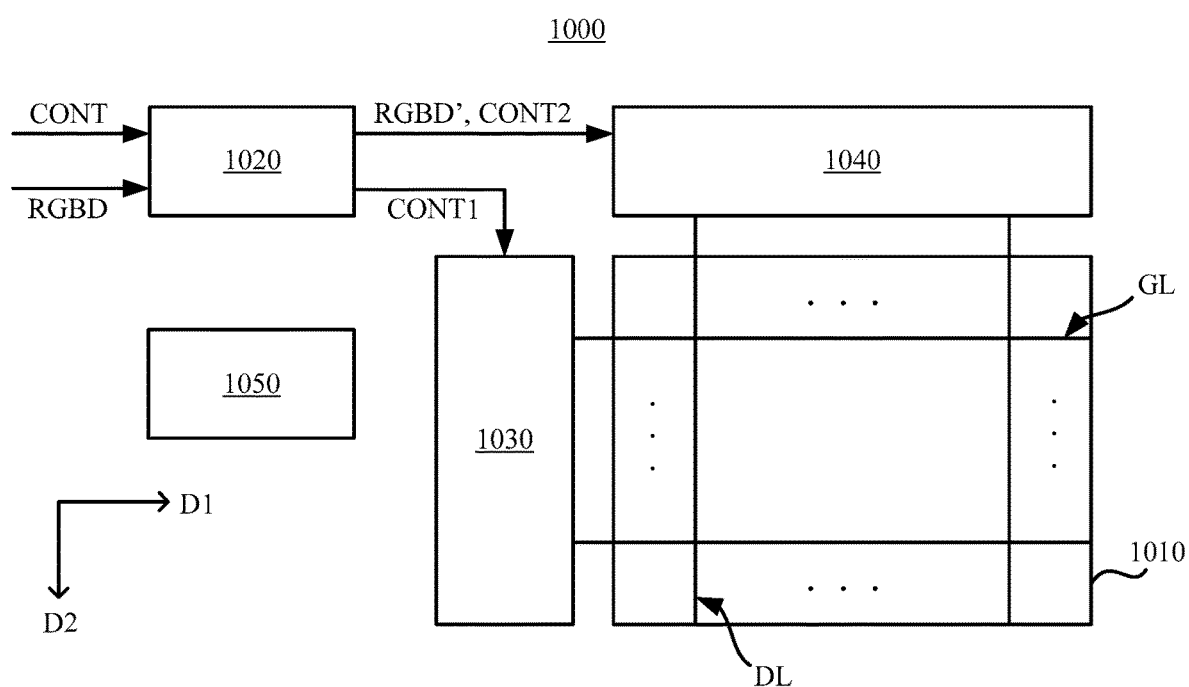
FIG. 10 is a schematic block diagram of a display device in accordance with an embodiment of the present disclosure.

FIG. 10 is a block diagram of a display device 1000 in accordance with an embodiment of the present disclosure. Referring to FIG. 10, the display device 1000 includes a display panel 1010, a timing controller 1020, a gate driver 1030, a data driver 1040, and a voltage generator 1050. The gate driver 1030 can take the form of the gate drive circuit 900 described above with respect to FIG. 9.

The display panel 1010 is connected to a plurality of gate lines GL extending in a first direction D1 and a plurality of data lines DL extending in a second direction D2 intersecting (e.g., substantially perpendicular to) the first direction D1. The display panel 1010 includes a plurality of pixels (not shown) arranged in a matrix form. Each of the pixels may be electrically connected to a corresponding one of the gate lines GL and a corresponding one of the data lines DL. The display panel 1010 can be a liquid crystal display panel, an organic light emitting diode (OLED) display panel, or any other suitable type of display panel.

The timing controller 1020 controls operations of the display panel 1010, the gate driver 1030, and the data driver 1040. The timing controller 1020 receives input image data RGBD and an input control signal CONT from an external device or a system interface. The input image data RGBD may include input pixel data for the plurality of pixels. Each of the input pixel data may include red gradation data R, green gradation data G, and blue gradation data B for a corresponding one of the plurality of pixels. The input control signal CONT may include a main clock signal, a data enable signal, a vertical sync signal, a horizontal sync signal, and the like. The timing controller 1020 generates output image data RGBD', a first control signal CONT1, and a second control signal CONT2 based on the input image data RGBD and the input control signal CONT. Implementations of the timing controller 1020 are known in the art. The timing controller 1020 can be implemented in a number of ways (e.g., using dedicated hardware) to perform the various functions discussed herein. A "processor" is an example of the timing controller 1020 that employs one or more microprocessors that can be programmed using software (e.g., microcode) to perform the various functions discussed herein. The timing controller 1020 can be implemented with or without a processor, and can also be implemented as a combination of dedicated hardware that performs some functions and a processor that performs other functions. Examples of the timing controller 1020 include, but are not limited to, conventional microprocessors, application specific integrated circuits (ASICs), and field programmable gate arrays (FPGAs).

The gate driver 1030 receives the first control signal CONT1 from the timing controller 1020. The first control signal CONT1 may include the respective clock signals described above with respect to FIG. 9. The gate driver 1030 generates a plurality of gate scan signals for output to the gate lines GL based on the first control signal CONT1. The gate driver 1030 may sequentially apply the plurality of gate scan signals to the gate lines GL.

The data driver 1040 receives the second control signal CONT2 and the output image data RGBD' from the timing controller 1020. The data driver 1040 generates a plurality of data voltages based on the second control signal CONT2 and the output image data RGBD'. The data driver 1040 can apply the generated plurality of data voltages to the data lines DL.

The voltage generator 1050 supplies power to the display panel 1010, the timing controller 1020, the gate driver 1030, the data driver 1040, and potentially additional components. Specifically, the voltage generator 1050 may be configured to supply the first voltage VSS having an inactive level and the second voltage VDD having an active level.

In the embodiments, the gate driver 1030 and/or the data driver 1040 can be disposed on the display panel 1010 or can be connected to the display panel 1010 by, for example, a Tape Carrier Package (TCP). For example, the gate driver 1030 can be integrated in the display panel 1010 as a gate driver on array (GOA) circuit.

In the embodiments, the display device 1000 can be any product or component having a display function, such as a display, a television, a digital photo frame, a mobile phone, a car display, or a tablet. For small size applications, such as cell phones or tablets, the gate driver 1030 can be disposed on a single lateral side (e.g., left or right) of the display device 1000. Alternatively, the shift register units connected to the odd gate lines GL in the gate driver 1030 may be disposed on one lateral side of the display device 1000, and the shift register unit connected to the even gate lines GL in the gate driver 1030 may be disposed on the other lateral side of the display device 1000. This allows for a more flexible design of the size of the bezel. For large-sized applications, such as notebook computers, monitors, televisions, etc., the display device 1000 can be provided with respective gate drivers 1030 on both lateral sides. In this case, the two gate drivers 1030 on both lateral sides simultaneously output the same scan signal to the gate lines GL, thereby reducing the signal delay due to the large size of the display panel.

The display device 1000 has the same advantages as those of the aforementioned shift register unit embodiments, and will not be described in detail herein.

The foregoing is only specific embodiments of the disclosure, and is not to be construed as limiting the disclosure. Variations or modifications of the disclosed embodiments can be devised and practiced by those of ordinary skill in the art without departing from the scope of the disclosure. Therefore, the disclosure should be subject to the scope of the appended claims.

What is claimed is:

1. A shift register unit, comprising:
    a signal input terminal configured to receive an input signal;
    a first clock signal terminal configured to receive a first clock signal;
    a first voltage terminal configured to receive a first voltage having an inactive level;
    a reset signal terminal configured to receive a reset signal;
    a first control signal terminal configured to receive one of a second clock signal that is an inverted version of the first clock signal, or a second voltage having an active level;
    a second control signal terminal configured to receive one of the first clock signal or the second clock signal;
    a third control signal terminal configured to be connected to one of a first node, the signal input terminal, or a second node;
    a signal output terminal configured to output an output signal;
    a first output control circuit configured to transfer the input signal to the first node in response to the input signal being active;
    a first output circuit configured to transfer the first clock signal from the first clock signal terminal to the signal output terminal in response to a potential at the first node being active, and configured to cause a change in the potential at the first node in response to a change in a level of the output signal;
    a second output control circuit configured to bring the first control signal terminal into conduction with the second node in response to a potential at the first control signal terminal being active, and configured to transfer the first voltage from the first voltage terminal to the second node in response to the potential at the first node being active;
    a second output circuit configured to transfer the first voltage from the first voltage terminal to the first node and the signal output terminal in response to a potential at the second node being active;
    a reset circuit configured to transfer the first voltage from the first voltage terminal to the first node and the signal output terminal in response to the reset signal being active; and
    a node set circuit configured to be enabled depending on a potential at the third control signal terminal, and configured to, when enabled, periodically transfer the first voltage from the first voltage terminal to the first node in response to a potential at the second control signal terminal alternately switching between an active level and an inactive level.

2. The shift register unit of claim 1, wherein the node set circuit comprises:
    a first transistor comprising a first gate connected to the second control signal terminal, a first electrode connected to the first node, and a second electrode connected to the first voltage terminal; and
    a second transistor comprising a second gate connected to the third control signal terminal, a first electrode connected to the second control signal terminal, and a second electrode connected to the first voltage terminal.

3. The shift register unit of claim 2,
    wherein the second control signal terminal is configured to receive the first clock signal, and
    wherein the third control signal terminal is configured to be connected to the first node.

4. The shift register unit of claim 2,
    wherein the second control signal terminal is configured to receive the second clock signal, and
    wherein the third control signal terminal is configured to be connected to the signal input terminal.

5. The shift register unit of claim 1, wherein the node set circuit comprises:
    a first transistor comprising a first gate, a first electrode connected to the first node, and a second electrode connected to the first voltage terminal; and
    a second transistor comprising a second gate connected to the third control signal terminal, a first electrode connected to the second control signal terminal, and a second electrode connected to the first gate of the first transistor.

6. The shift register unit of claim 5,
    wherein the first control signal terminal is configured to receive the second voltage,
    wherein the second control signal terminal is configured to receive the first clock signal, and
    wherein the third control signal terminal is configured to be connected to the second node.

7. The shift register unit of claim 5,
    wherein the first control signal terminal is configured to receive the second clock signal,
    wherein the second control signal terminal is configured to receive the second clock signal, and
    wherein the third control signal terminal is configured to be connected to the second node.

8. The shift register unit of claim 1, wherein the first output control circuit comprises a third transistor comprising a third gate connected to the signal input terminal, a first electrode connected to the signal input terminal, and a second electrode connected to the first node.

9. The shift register unit of claim 8, wherein the first output control circuit further comprises a thirteenth transistor having a thirteenth gate connected to the first control signal terminal, a first electrode connected to the signal input terminal, and a second electrode connected to the first node.

10. The shift register unit of claim 1, wherein the first output circuit comprises:

a drive transistor comprising a drive gate connected to the first node, a first electrode connected to the first clock signal terminal, and a second electrode connected to the signal output terminal; and a storage capacitor connected between the first node and the signal output terminal.

11. The shift register unit of claim 1, wherein the second output control circuit comprises:
   a fourth transistor comprising a fourth gate connected to the first control signal terminal, a first electrode connected to the first control signal terminal, and a second electrode;
   a fifth transistor comprising a fifth gate connected to the second electrode of the fourth transistor, a first electrode connected to the first control signal terminal, and a second electrode connected to the second node;
   a sixth transistor comprising a sixth gate connected to the first node, a first electrode connected to the second node, and a second electrode connected to the first voltage terminal; and
   a seventh transistor comprising a seventh gate connected to the first node, a first electrode connected to the second electrode of the fourth transistor, and a second electrode connected to the first voltage terminal.

12. The shift register unit of claim 1, wherein the second output circuit comprises:
   an eighth transistor comprising an eighth gate connected to the second node, a first electrode connected to the first node, and a second electrode connected to the first voltage terminal; and
   a ninth transistor comprising a ninth gate connected to the second node, a first electrode connected to the signal output terminal, and a second electrode connected to the first voltage terminal.

13. The shift register unit of claim 1, wherein the reset circuit comprises:
   a tenth transistor comprising a tenth gate connected to the reset signal terminal, a first electrode connected to the first node, and a second electrode connected to the first voltage terminal; and
   an eleventh transistor comprising a eleventh gate connected to the reset signal terminal, a first electrode connected to the signal output terminal, and a second electrode connected to the first voltage terminal.

14. The shift register unit of claim 1, further comprising:
   an auxiliary output circuit configured to transfer the first voltage from the first voltage terminal to the signal output terminal in response to the potential at the first control signal terminal being active.

15. The shift register unit of claim 14, wherein the auxiliary output circuit comprises a twelfth transistor comprising a twelfth gate connected to the first control signal terminal, a first electrode connected to the signal output terminal, and a second electrode connected to the first voltage terminal.

16. The shift register unit of claim 2, wherein the second transistor is configured to have a faster response speed than that of the first transistor.

17. A gate drive circuit comprising a plurality of cascaded shift register units as recited in claim 1,
   wherein the signal input terminal of a first one of the plurality of cascaded shift register units is configured to receive a start signal as the input signal;
   wherein the signal output terminal of each of the plurality of cascaded shift register units, except for a last one of the plurality of cascaded shift register units, is connected to the signal input terminal of an adjacent next one of the plurality of cascaded shift register units; and
   wherein the signal output terminal of each of the plurality of cascaded shift register units, except for the first one of the plurality of cascaded shift register units, is connected to the reset signal terminal of an adjacent previous one of the plurality of cascaded shift register units.

18. A display device comprising the gate drive circuit of claim 17.

19. A method for driving the shift register unit of claim 1, comprising:
   performing a first phase in which the first output control circuit transfers the input signal to the first node in response to the input signal being active, the first output circuit transfers the first clock signal from the first clock signal terminal to the signal output terminal in response to the potential at the first node being active, and the second output control circuit brings the first control signal terminal into conduction with the second node in response to the potential at the first control signal terminal being active;
   performing a second phase in which the first output circuit transfers the first clock signal from the first clock signal terminal to the signal output terminal in response to the potential at the first node being active, and the second output control circuit transfers the first voltage from the first voltage terminal to the second node in response to the potential at the first node being active; and
   performing a third phase in which the reset circuit transfers the first voltage from the first voltage terminal to the first node and the signal output terminal in response to the reset signal being active, the second output control circuit brings the first control signal terminal into conduction with the second node in response to the potential at the first control signal terminal being active, and the second output circuit transfers the first voltage from the first voltage terminal to the first node and the signal output terminal in response to the potential at the second node being active.

20. The method of claim 19, further comprising:
   enabling the node set circuit after the third phase, and
   periodically transferring, by the node set circuit when enabled, the first voltage from the first voltage terminal to the first node in response to the potential at the second control signal terminal alternately switching between an active level and an inactive level.

* * * * *